(12) United States Patent
Hu et al.

(10) Patent No.: US 11,233,110 B2
(45) Date of Patent: Jan. 25, 2022

(54) ORGANIC LIGHT-EMITTING DIODE DISPLAY SUBSTRATE, DISPLAY PANEL, DISPLAY DEVICE, MANUFACTURING METHOD THEREOF, AND FINGERPRINT IDENTIFICATION MODULE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hongwei Hu, Beijing (CN); Yanxia Xin, Beijing (CN); Xueping Li, Beijing (CN); Zheng Bao, Beijing (CN); Yihao Wu, Beijing (CN); Peng Xu, Beijing (CN); Donghong Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 63 days.

(21) Appl. No.: 16/766,613

(22) PCT Filed: May 23, 2019

(86) PCT No.: PCT/CN2019/088093
§ 371 (c)(1),
(2) Date: May 22, 2020

(87) PCT Pub. No.: WO2020/232692
PCT Pub. Date: Nov. 26, 2020

(65) Prior Publication Data
US 2021/0036085 A1    Feb. 4, 2021

(51) Int. Cl.
*H01L 27/32* (2006.01)
*G06K 9/00* (2006.01)
*H01L 51/56* (2006.01)

(52) U.S. Cl.
CPC ........ *H01L 27/3272* (2013.01); *G06K 9/0004* (2013.01); *H01L 27/3234* (2013.01); *H01L 51/56* (2013.01); *H01L 2227/323* (2013.01)

(58) Field of Classification Search
None
See application file for complete search history.

(56) References Cited

U.S. PATENT DOCUMENTS

2019/0122025 A1* 4/2019 Gove ............... G06K 9/00107
2019/0220121 A1* 7/2019 Kim ................. H01L 51/5012
(Continued)

FOREIGN PATENT DOCUMENTS

CN    108461533 A    8/2018
CN    108565354 A    9/2018
(Continued)

OTHER PUBLICATIONS

Machine translation of CN 109308435 (Year: 2019).*

*Primary Examiner* — J. E. Schoenholtz
(74) *Attorney, Agent, or Firm* — Muncy, Geissler, Olds & Lowe, P.C.

(57) ABSTRACT

An OLED display substrate, a display panel, a display device, a manufacturing method and a fingerprint identification module are provided. The OLED display substrate includes a microporous light-shielding pattern arranged between adjacent pixel regions and including a plurality of pinholes. The microporous light-shielding pattern is arranged at a same layer as, and insulated from, a nontransparent electrode of the OLED display substrate.

16 Claims, 3 Drawing Sheets

(56) References Cited

U.S. PATENT DOCUMENTS

| | | | |
|---|---|---|---|
| 2019/0311176 A1* | 10/2019 | Haddad | G06K 9/00046 |
| 2020/0020753 A1 | 1/2020 | Zhang et al. | |
| 2020/0219946 A1* | 7/2020 | Ryu | H01L 27/3227 |
| 2020/0219948 A1* | 7/2020 | Kim, II | G09G 3/3266 |
| 2021/0124895 A1* | 4/2021 | Xiong | G06K 9/0004 |

FOREIGN PATENT DOCUMENTS

| | | | | |
|---|---|---|---|---|
| CN | 108878501 A | | 11/2018 | |
| CN | 109308435 | * | 2/2019 | ......... G06K 9/00013 |
| CN | 109545825 A | | 3/2019 | |
| WO | WO-2019035629 A1 | | 2/2019 | |

\* cited by examiner

ORGANIC LIGHT-EMITTING DIODE
DISPLAY SUBSTRATE, DISPLAY PANEL,
DISPLAY DEVICE, MANUFACTURING
METHOD THEREOF, AND FINGERPRINT
IDENTIFICATION MODULE

CROSS-REFERENCE TO RELATED APPLICATION

The present application is the U.S. national phase of PCT Application No. PCT/CN2019/088093 filed on May 23, 2019, which is incorporated herein by reference in its entirety.

TECHNICAL FIELD

The present disclosure relates to the field of display technology, in particular to an Organic Light-Emitting Diode (OLED) display substrate, a display panel, a display device, a manufacturing method thereof and a fingerprint identification module.

BACKGROUND

As a principle of optical in-screen fingerprint identification, when light beams are emitted by a display panel toward a fingerprint, different energy levels of the light beams are absorbed and reflected by ridges and valleys of the fingerprint, and an optical sensor in the display screen is capable of sensing the energy difference to generate fringes with different brightness values, i.e., fingerprint image information.

SUMMARY

An object of the present disclosure is to provide an OLED display substrate, a display panel, a display device, a manufacturing method and a fingerprint identification module, so as to reduce a thickness of a fingerprint identification product.

In one aspect, the present disclosure provides in some embodiments an OLED display substrate, including a microporous light-shielding pattern arranged between adjacent pixel regions and including a plurality of pinholes. The microporous light-shielding pattern is arranged at a same layer as, and insulated from, a nontransparent electrode of the OLED display substrate.

In a possible embodiment of the present disclosure, the microporous light-shielding pattern is made of a same material as the nontransparent electrode of the OLED display substrate.

In a possible embodiment of the present disclosure, the nontransparent electrode is an anode of the OLED display substrate.

In a possible embodiment of the present disclosure, the nontransparent electrode is an electrode of a thin film transistor (TFT) of the OLED display substrate.

In a possible embodiment of the present disclosure, the microporous light-shielding pattern is used for pinhole imaging.

In a possible embodiment of the present disclosure, the OLED display substrate specifically includes: a base substrate; a TFT array layer arranged on the base substrate; a planarization layer covering the TFT array layer; and the anode and the microporous light-shielding pattern arranged on the planarization layer and separated from each other.

In another aspect, the present disclosure provides in some embodiments a fingerprint identification module including the above-mentioned OLED display substrate and an optical sensor arranged at a non-light-exiting side of the OLED display substrate. An orthogonal projection of the optical sensor onto the OLED display substrate at least partially overlaps an orthogonal projection of the microporous light-shielding pattern onto the OLED display substrate.

In a possible embodiment of the present disclosure, the orthogonal projection of the optical sensor onto the OLED display substrate is located within the orthogonal projection of the microporous light-shielding pattern onto the OLED display substrate.

In yet another aspect, the present disclosure provides in some embodiments a display panel including the above-mentioned OLED display substrate.

In still yet another aspect, the present disclosure provides in some embodiments a display device including the above-mentioned fingerprint identification module.

In still yet another aspect, the present disclosure provides in some embodiments a method for manufacturing an OLED display substrate, including forming a microporous light-shielding pattern between adjacent pixel regions of the OLED display substrate. The microporous light-shielding pattern is arranged at a same layer as, and insulated from, a nontransparent electrode of the OLED display substrate, and includes a plurality of pinholes.

In a possible embodiment of the present disclosure, the forming the microporous light-shielding pattern includes forming the microporous light-shielding pattern and an anode of the OLED display substrate through a single patterning process.

In a possible embodiment of the present disclosure, the forming the microporous light-shielding pattern includes forming the microporous light-shielding pattern and an electrode of a TFT of the OLED display substrate through a single patterning process.

Figure 1:
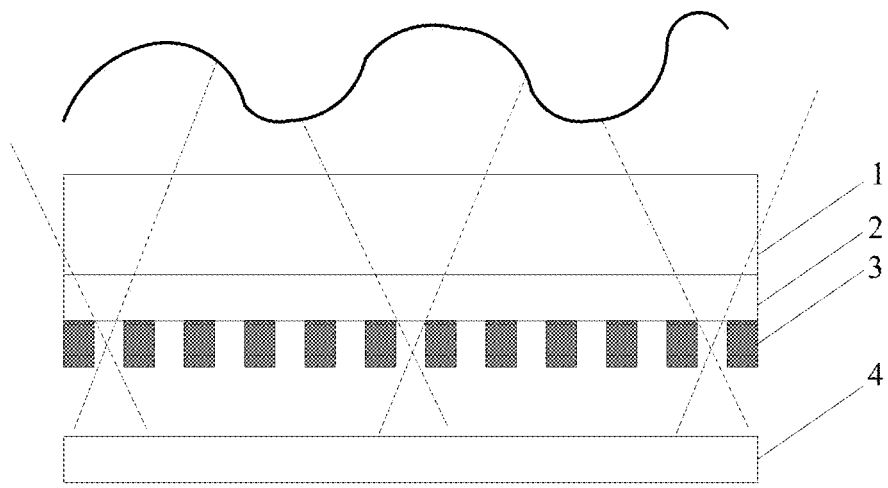
FIG. 1 is a schematic view showing the addition of a collimator array on an OLED display substrate for fingerprint identification.

REFERENCE SIGN LIST 1 glass cover plate
2 OLED display substrate
3 collimator array
4 optical sensor
5 microporous light-shielding layer
6 microporous light-shielding pattern 7 anode
8 pinhole
9 first nontransparent pattern
10 opening
11 second nontransparent pattern
12 connection pattern
21 base substrate
22 TFT array layer
23 planarization layer
24 pixel definition layer

DETAILED DESCRIPTION

In order to make the objects, the technical solutions and the advantages of the present disclosure more apparent, the present disclosure will be described hereinafter in a clear and complete manner in conjunction with the drawings and embodiments.

As a principle of optical in-screen fingerprint identification, when light beams are emitted toward a fingerprint, different energy levels of the light beams are absorbed and reflected by ridges and valleys of the fingerprint, and an optical sensor in a display screen is capable of sensing the energy difference to generate fringes with different brightness values, i.e., fingerprint image information. For an OLED display substrate, the emitted light beams are reflected by the fingerprint, then pass through a gap between pixel regions toward a collimator array or a microporous array under the display screen, and then reach an optical sensor, so that the optical sensor acquires the fingerprint information for identification.

Figure 2:
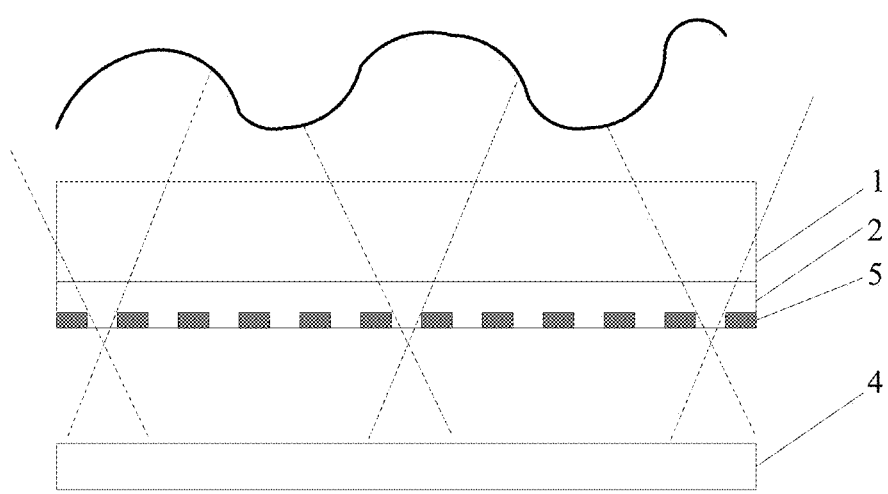
FIG. 2 is a schematic view showing the addition of a microporous light-shielding layer in the OLED display substrate for fingerprint identification.

In the related art, it is necessary to add a collimator array 3 on an OLED display substrate 2 for the fingerprint identification as shown in FIG. 1, or add a microporous light-shielding layer 5 in the OLED display substrate 2 for the fingerprint identification as shown in FIG. 2. The manufacture process thereof is complex, and a thickness of a resultant fingerprint identification product increases, so the yield of the fingerprint identification product may be adversely affected and the manufacture cost may increase. In addition, when the microporous light-shielding layer 5 is added in the OLED display substrate 2, the performance of a TFT may probably be adversely affected.

An object of the present disclosure is to provide an OLED display substrate, a display panel, a display device, a manufacturing method and a fingerprint identification module, so as to reduce the thickness of the fingerprint identification product.

The present disclosure provides in some embodiments an OLED display substrate, which includes a microporous light-shielding pattern arranged between adjacent pixel regions and including a plurality of pinholes. The microporous light-shielding pattern is arranged at a same layer as, and insulated from, a nontransparent electrode of the OLED display substrate.

According to the embodiments of the present disclosure, the OLED display substrate may include the microporous light-shielding pattern between the adjacent pixel regions, the microporous light-shielding pattern may include the plurality of pinholes for fingerprint imaging, and the microporous light-shielding pattern may be arranged at a same layer as, and insulated from, the nontransparent electrode of the OLED display substrate. In this way, it is unnecessary to add a film layer in the OLED display substrate or a collimator array on the OLED display substrate for the fingerprint identification, so it is able to reduce a thickness of a fingerprint identification product. In addition, the microporous light-shielding pattern may be arranged between the adjacent pixel regions, so it is able to prevent the performance of a TFT of the OLED display substrate from being adversely affected.

When the microporous light-shielding pattern is arranged at the same layer as the nontransparent electrode of the OLED display substrate, it means that a surface of the microporous light-shielding pattern close to a base substrate of the OLED display substrate is located in a same plane as a surface of the nontransparent electrode close to the base substrate.

Figure 3:
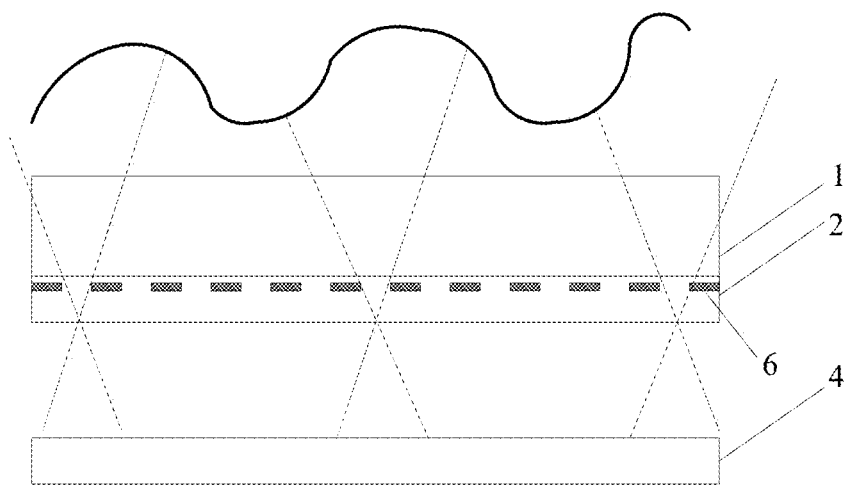
FIG. 3 is a schematic view showing a principle of the fingerprint identification using a microporous light-shielding pattern according to one embodiment of the present disclosure.

In the embodiments of the present disclosure, as shown in FIG. 3, the microporous light-shielding pattern 6 may be arranged inside the OLED display substrate 2 and arranged at a same layer as an original film layer of the OLED display substrate 2. In this way, it is unnecessary to provide an additional film layer in the OLED display substrate for the fingerprint identification, so it is able to reduce the thickness of the fingerprint identification product. In order to prevent the normal display of the OLED display substrate 2 from being adversely affected, the microporous light-shielding pattern 6 may be arranged between the adjacent pixel regions.

As shown in FIG. 3, the OLED display substrate 2 may be covered with a glass cover plate 1, and an optical sensor 4 may be arranged at a side of the OLED display substrate 2 away from the glass cover plate 1. When the glass cover plate 1 is touched by a finger, light beams emitted by the OLED display substrate 2 may be reflected by a fingerprint toward the optical sensor 4 under the OLED display substrate 2 through the pinholes of the microporous light-shielding pattern 6 between the adjacent pixel regions. The optical sensor 4 may receive the light beams for the fingerprint identification.

The microporous light-shielding pattern 6 may be used for pinhole imaging. The pinhole imaging may refer to an imaging operation using the light-shielding pattern with the pinholes, so the microporous light-shielding pattern needs to be made of a nontransparent material, i.e., a material having a light transmittance of 0. In a possible embodiment of the present disclosure, the microporous light-shielding pattern may be made of a same material as the nontransparent electrode of the OLED display substrate. In this way, it is able to form the microporous light-shielding pattern and the nontransparent electrode of the OLED display substrate simultaneously through a single patterning process, simplify a manufacture process of the fingerprint identification product, increase the yield of the fingerprint identification product, and reduce the manufacture cost as well as a thickness of the fingerprint identification product.

Figure 4:
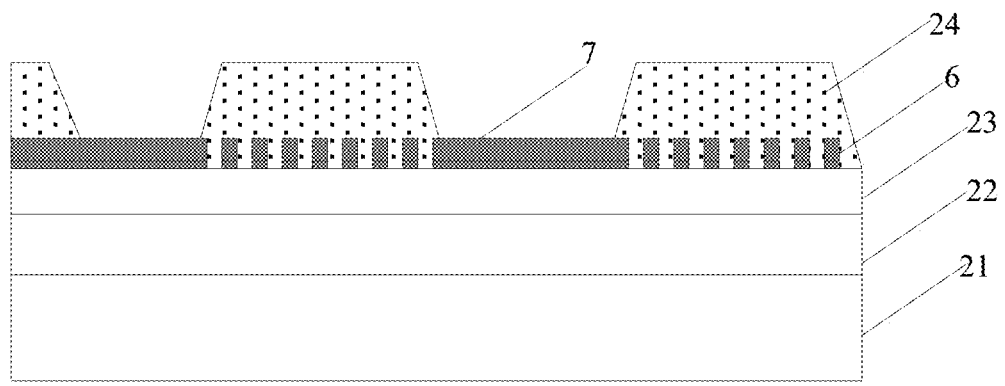
FIG. 4 is a schematic view showing the formation of the microporous light-shielding pattern using a same material as an anode according to one embodiment of the present disclosure.

In a possible embodiment of the present disclosure, the nontransparent electrode may be an anode of the OLED display substrate. As shown in FIG. 4, the OLED display substrate may include a base substrate 21, a TFT array layer 22 on the base substrate 21, a planarization layer 23, the anode 7 and the microporous light-shielding pattern 6 on the planarization layer 23, and a pixel definition layer 24. The TFT array layer 22 may include TFTs and a signal line connected to each TFT. The anode 7 and the microporous light-shielding pattern 6 may be created from a same layer and made of a light-reflecting metal.

Figure 5:
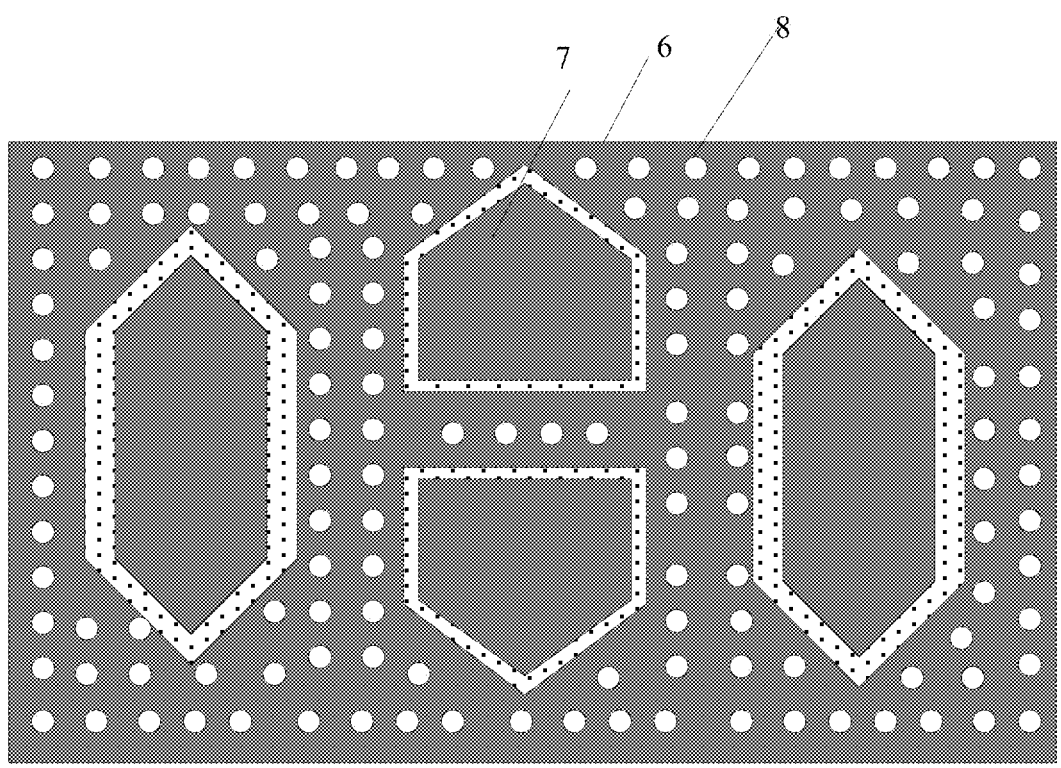
FIG. 5 is a planar view of a display substrate according to one embodiment of the present disclosure.

In a conventional OLED display substrate, the anode is located at each pixel region, and during the formation of a pattern of the anode through a patterning process, an anode material between adjacent pixel regions needs to be removed. In the embodiments of the present disclosure, it is unnecessary to fully remove the anode material between the adjacent pixel regions, and instead, the microporous light-shielding pattern 6 may be formed through the anode material between the adjacent pixel regions. As shown in FIG. 5, in order to prevent the normal display from being adversely affected, the microporous light-shielding pattern 6 may be separated from and insulated from the anode 7. The microporous light-shielding pattern 6 may include a plurality of pinholes 8. When the glass cover plate 1 is touched by a finger, light beams emitted by the OLED display substrate 2 may be reflected by a fingerprint toward the optical sensor 4 under the OLED display substrate 2 through the pinholes 8 of the microporous light-shielding pattern 6 between the pixel regions, and the optical sensor 4 may receive the light beams for the fingerprint identification.

In the embodiments of the present disclosure, it is unnecessary to provide an additional microporous light-shielding layer in the OLED display substrate or an additional collimator array on the OLED display substrate for the fingerprint identification. Instead, it is merely necessary to provide the microporous light-shielding pattern 6 on a mask plate for forming the anode. As a result, it is able to simplify the manufacture process for the fingerprint identification, increase the yield of the fingerprint identification product, and reduce the manufacture cost as well as the thickness of the fingerprint identification product.

Of course, the nontransparent electrode may not be limited to the anode of the OLED display substrate, and it may also be an electrode of the TFT of the OLED display substrate, e.g., a gate electrode, a source electrode or a drain electrode. During the formation of the electrode of the TFT through the patterning process, the microporous light-shielding pattern 6 may be formed through a part of an electrode material between the adjacent pixel regions. In order to prevent the normal display from being adversely affected, the microporous light-shielding pattern 6 may be separated from and insulated from the electrode of the TFT. When the glass cover plate 1 is touched by the finger, the light beams emitted by the OLED display substrate 2 may be reflected by the fingerprint toward the optical sensor 4 under the OLED display substrate 2 through the pinholes 8 of the microporous light-shielding pattern 6 between the pixel regions, and the optical sensor 4 may receive the light beams for the fingerprint identification.

In the embodiments of the present disclosure, it is unnecessary to provide an additional microporous light-shielding layer in the OLED display substrate or an additional collimator array on the OLED display substrate for the fingerprint identification. Instead, it is merely necessary to provide the microporous light-shielding pattern 6 on a mask plate for forming the electrode of the TFT. As a result, it is able to simplify the manufacture process for the fingerprint identification, increase the yield of the fingerprint identification product, and reduce the manufacture cost as well as the thickness of the fingerprint identification product.

The present disclosure further provides in some embodiments a fingerprint identification module, which includes the above-mentioned OLED display substrate, an optical sensor arranged at a non-light-exiting side of the OLED display substrate. An orthogonal projection of the optical sensor onto the OLED display substrate at least partially overlaps an orthogonal projection of the microporous light-shielding pattern onto the OLED display substrate, so that the optical sensor is capable of receiving light beams passing through the pinholes.

In a possible embodiment of the present disclosure, the orthogonal projection of the optical sensor onto the OLED display substrate may be located within the orthogonal projection of the microporous light-shielding pattern onto the OLED display substrate, i.e., the optical sensor may be arranged in such a manner as to directly face the microporous light-shielding pattern, so that the optical sensor may receive the light beams passing through the pinholes to the greatest extent.

The present disclosure further provides in some embodiments a display panel, which includes the above-mentioned OLED display substrate. In the embodiments of the present disclosure, the OLED display substrate may include the microporous light-shielding pattern between the adjacent pixel regions, and the microporous light-shielding pattern may include a plurality of pinholes for fingerprint imaging. The microporous light-shielding pattern may be arranged at a same layer as, and insulated from, the nontransparent electrode of the OLED display substrate. As a result, it is unnecessary to provide an additional film layer in the OLED display substrate or an additional collimator array on the OLED display substrate for the fingerprint identification, so it is able to reduce the thickness of the fingerprint identification product.

The present disclosure further provides in some embodiments a display device, which includes the above-mentioned fingerprint identification module. The display device may be any product or member having a display function, e.g., television, display, digital photo frame, mobile phone or flat-panel computer. The display device may further include a flexible circuit board, a printed circuit board and a back plate.

The present disclosure further provides in some embodiments a method of manufacturing an OLED display substrate, which includes forming a microporous light-shielding pattern between adjacent pixel regions of the OLED display substrate. The microporous light-shielding pattern is arranged at a same layer as, and insulated from, a nontransparent electrode of the OLED display substrate, and includes a plurality of pinholes.

In the embodiments of the present disclosure, the microporous light-shielding pattern may be formed between the adjacent pixel regions and include the plurality of pinholes for fingerprint imaging. The microporous light-shielding pattern may be arranged at a same layer as, and insulated from, the nontransparent electrode of the OLED display substrate. In this way, it is unnecessary to provide an additional film layer in the OLED display substrate or an additional collimator array on the OLED display substrate for the fingerprint identification, so it is able to reduce the thickness of the fingerprint identification product. In addition, when the microporous light-shielding pattern is arranged between the adjacent pixel regions, it is able to prevent the performance of the TFT of the OLED display substrate from being adversely affected.

In the embodiments of the present disclosure, as shown in FIG. 3, the microporous light-shielding pattern 6 may be arranged inside the OLED display substrate 2 and arranged at a same layer as an original film layer of the OLED display substrate 2. In this way, it is unnecessary to provide an additional film layer in the OLED display substrate for the fingerprint identification, so it is able to reduce the thickness of the fingerprint identification product. In order to prevent the normal display of the OLED display substrate 2 from being adversely affected, the microporous light-shielding pattern 6 may be arranged between the adjacent pixel regions.

As shown in FIG. 3, the OLED display substrate 2 may be covered with the glass cover plate 1, and the optical sensor 4 may be arranged at a side of the OLED display substrate 2 away from the glass cover plate 1. When the glass cover plate 1 is touched by a finger, the light beams emitted by the OLED display substrate 2 may be reflected by the fingerprint toward the optical sensor 4 under the OLED display substrate 2 through the pinholes of the microporous light-shielding pattern 6 between the adjacent pixel regions. The optical sensor 4 may receive the light beams for the fingerprint identification.

In a possible embodiment of the present disclosure, the microporous light-shielding pattern and the nontransparent electrode of the OLED display substrate may be formed simultaneously through a single patterning process, so as to simplify the manufacture process of the fingerprint identification product, increase the yield of the fingerprint identification product, and reduce the manufacture cost as well as the thickness of the fingerprint identification product.

In a possible embodiment of the present disclosure, the nontransparent electrode may be an anode of the OLED display substrate. The forming the microporous light-shielding pattern arranged between the adjacent pixel regions and at the same layer as the nontransparent electrode of the OLED display substrate may include forming the microporous light-shielding pattern and the anode of the OLED display substrate through a single patterning process.

As shown in FIG. 4, the OLED display substrate may include the base substrate 21, the TFT array layer 22 on the base substrate 21, the planarization layer 23, the anode 7 and the microporous light-shielding pattern 6 on the planarization layer 23, and the pixel definition layer 24. The TFT array layer 22 may include TFTs and a signal line connected to each TFT. The anode 7 and the microporous light-shielding pattern 6 may be created from a same layer and made of a light-reflecting metal.

In the conventional OLED display substrate, the anode is located at each pixel region, and during the formation of a pattern of the anode through a patterning process, an anode material between adjacent pixel regions needs to be removed. In the embodiments of the present disclosure, it is unnecessary to fully remove the anode material between the adjacent pixel regions, and instead, the microporous light-shielding pattern 6 may be formed through the anode material between the adjacent pixel regions. As shown in FIG. 5, in order to prevent the normal display from being adversely affected, the microporous light-shielding pattern 6 may be separated from and insulated from the anode 7. The microporous light-shielding pattern 6 may include the plurality of pinholes 8. When the glass cover plate 1 is touched by the finger, light beams emitted by the OLED display substrate 2 may be reflected by the fingerprint toward the optical sensor 4 under the OLED display substrate 2 through the pinholes 8 of the microporous light-shielding pattern 6 between the pixel regions, and the optical sensor 4 may receive the light beams for the fingerprint identification.

Figure 6:
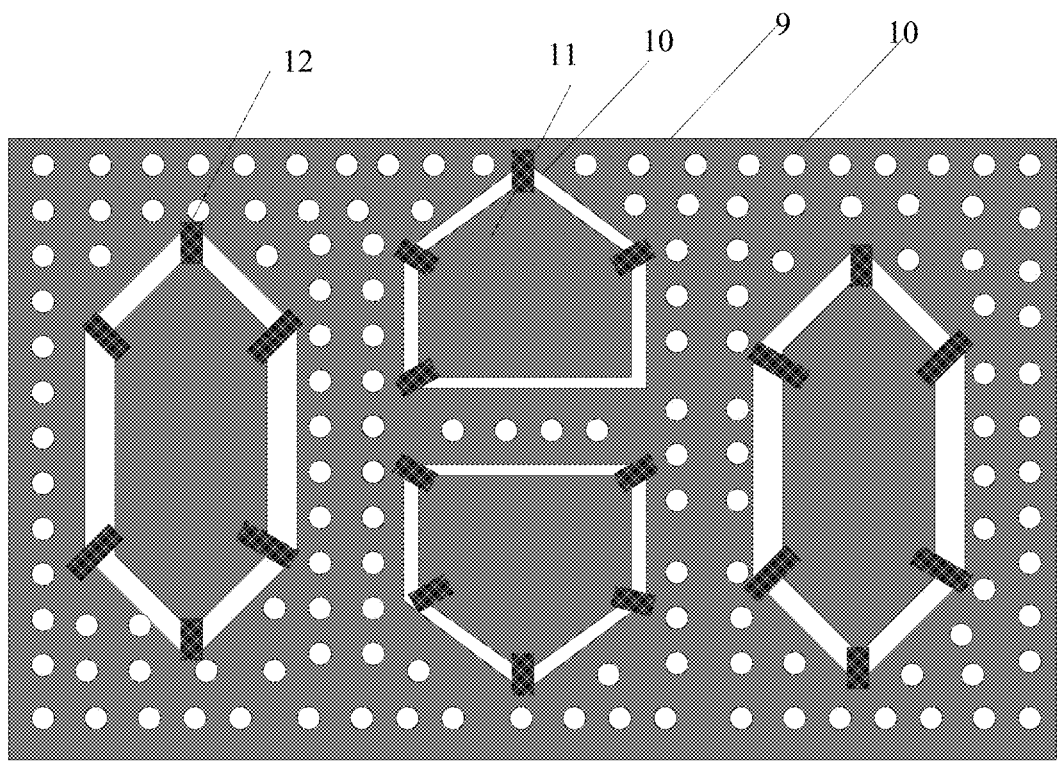
FIG. 6 is a schematic view showing a mask plate according to one embodiment of the present disclosure.

The present disclosure further provides in some embodiments a mask plate for manufacturing the microporous light-shielding pattern and the anode of the OLED display substrate. As shown in FIG. 6, the mask plate may include a second nontransparent pattern 11 corresponding to the anode and a first nontransparent pattern 9 corresponding to the microporous light-shielding pattern. In order to enable the anode to be insulated from the microporous light-shielding pattern, an opening 10 may be arranged between the second nontransparent pattern 11 and the first nontransparent pattern 9. In addition, the first nontransparent pattern 9 is provided with openings 10 corresponding to pinholes. In order to prevent the second nontransparent pattern 11 from falling off from the mask plate, the mask plate may further include a connection pattern 12 connecting the second nontransparent pattern 11 and the first nontransparent pattern 9. During the formation of the microporous light-shielding pattern and the anode, an anode material layer may be formed. Next, a photoresist may be applied onto the anode material layer, exposed with the mask plate in FIG. 6, and developed to form a photoresist reserved region corresponding to a region of the microporous light-shielding pattern other than the pinholes, a photoresist reserved region corresponding to the anode, a photoresist unreserved region corresponding to a region between the anode and the microporous light-shielding pattern, and a photoresist unreserved region corresponding to the pinholes. Then, the photoresist at the photoresist unreserved regions may be removed, and the anode material layer not covered by the photoresist may be etched off, so as to form the microporous light-shielding pattern and the anode. In order to enable the photoresist shielded by the connection pattern 12 to receive the light beams during the exposure, the connection pattern 12 may have a width not greater than 2 µm, e.g., 1 to 2 µm. In this way, during the exposure, the photoresist shielded by the connection pattern 12 may also receive the light beams due to diffraction. In order to further prevent the residual photoresist at a region shielded by the connection pattern 12, in a possible embodiment of the present disclosure, the connection pattern 12 may have a light transmittance of smaller than 50%. In this way, it is able to prevent the residual photoresist at the region shielded by the connection pattern 12, and remove the photoresist at the region between the anode and the microporous light-shielding pattern, thereby to enable the anode to be separated from, i.e., insulated from, the microporous light-shielding pattern.

In the embodiments of the present disclosure, it is unnecessary to provide an additional microporous light-shielding layer in the OLED display substrate or an additional collimator array on the OLED display substrate for the fingerprint identification. Instead, it is merely necessary to provide the microporous light-shielding pattern 6 on a mask plate for forming the anode. As a result, it is able to simplify the manufacture process for the fingerprint identification, increase the yield of the fingerprint identification product, and reduce the manufacture cost as well as the thickness of the fingerprint identification product.

Of course, the nontransparent electrode may not be limited to the anode of the OLED display substrate, and it may also be an electrode of the TFT of the OLED display substrate, e.g., a gate electrode, a source electrode or a drain electrode. The forming the microporous light-shielding pattern arranged between the adjacent pixel regions and at the same layer as the nontransparent electrode of the OLED display substrate may include forming the microporous light-shielding pattern and the electrode of the TFT of the OLED display substrate through a single patterning process.

During the formation of the electrode of the TFT through the patterning process, the microporous light-shielding pattern 6 may be formed through a part of an electrode material between the adjacent pixel regions. In order to prevent the normal display from being adversely affected, the microporous light-shielding pattern 6 may be separated from and insulated from the electrode of the TFT. When the glass cover plate 1 is touched by the finger, the light beams emitted by the OLED display substrate 2 may be reflected by the fingerprint toward the optical sensor 4 under the OLED display substrate 2 through the pinholes 8 of the microporous light-shielding pattern 6 between the pixel regions, and the optical sensor 4 may receive the light beams for the fingerprint identification.

In the embodiments of the present disclosure, it is unnecessary to provide an additional microporous light-shielding layer in the OLED display substrate or an additional collimator array on the OLED display substrate for the fingerprint identification. Instead, it is merely necessary to provide the microporous light-shielding pattern 6 on a mask plate for forming the electrode of the TFT. As a result, it is able to simplify the manufacture process for the fingerprint identification, increase the yield of the fingerprint identification product, and reduce the manufacture cost as well as the thickness of the fingerprint identification product.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An Organic Light-Emitting Diode (OLED) display substrate, comprising a microporous light-shielding pattern arranged between adjacent pixel regions and comprising a plurality of pinholes, wherein the microporous light-shielding pattern is arranged at a same layer as, and insulated from, a nontransparent electrode of the OLED display substrate.

2. The OLED display substrate according to claim 1, wherein the microporous light-shielding pattern is made of a same material as the nontransparent electrode of the OLED display substrate.

3. The OLED display substrate according to claim 1, wherein the nontransparent electrode is an anode of the OLED display substrate.

4. The OLED display substrate according to claim 1, wherein the nontransparent electrode is an electrode of a thin film transistor (TFT) of the OLED display substrate.

5. The OLED display substrate according to claim 1, wherein the microporous light-shielding pattern is used for pinhole imaging.

6. The OLED display substrate according to claim 3, wherein the OLED display substrate specifically comprises:
   a base substrate;
   a TFT array layer arranged on the base substrate;
   a planarization layer covering the TFT array layer; and
   the anode and the microporous light-shielding pattern arranged on the planarization layer and separated from each other.

7. A fingerprint identification module, comprising the OLED display substrate according to claim 1, and an optical sensor arranged at a non-light-exiting side of the OLED display substrate, wherein an orthogonal projection of the optical sensor onto the OLED display substrate at least partially overlaps an orthogonal projection of the microporous light-shielding pattern onto the OLED display substrate.

8. The fingerprint identification module according to claim 7, wherein the orthogonal projection of the optical sensor onto the OLED display substrate is located within the orthogonal projection of the microporous light-shielding pattern onto the OLED display substrate.

9. A display panel, comprising the OLED display substrate according to claim 1.

10. A display device, comprising the fingerprint identification module according to claim 7.

11. A method of manufacturing an OLED display substrate, comprising:
    forming a microporous light-shielding pattern between adjacent pixel regions of the OLED display substrate, wherein the microporous light-shielding pattern is arranged at a same layer as, and insulated from, a nontransparent electrode of the OLED display substrate, and comprises a plurality of pinholes.

12. The method according to claim 11, wherein the forming the microporous light-shielding pattern comprises forming the microporous light-shielding pattern and an anode of the OLED display substrate through a single patterning process.

13. The method according to claim 11, wherein the forming the microporous light-shielding pattern comprises forming the microporous light-shielding pattern and an electrode of a TFT of the OLED display substrate through a single patterning process.

14. The OLED display substrate according to claim 2, wherein the nontransparent electrode is an anode of the OLED display substrate.

15. The OLED display substrate according to claim 2, wherein the nontransparent electrode is an electrode of a thin film transistor (TFT) of the OLED display substrate.

16. A display device, comprising the fingerprint identification module according to claim 8.

* * * * *